(12) United States Patent
Chen et al.

(10) Patent No.: US 7,803,713 B2
(45) Date of Patent: Sep. 28, 2010

(54) METHOD FOR FABRICATING AIR GAP FOR SEMICONDUCTOR DEVICE

(75) Inventors: Hsien-Wei Chen, Tainan County (TW); Hsueh-Chung Chen, Taipei County (TW); Shin-Puu Jeng, Hsinchu County (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 923 days.

(21) Appl. No.: 11/533,809

(22) Filed: Sep. 21, 2006

(65) Prior Publication Data

US 2008/0076258 A1    Mar. 27, 2008

(51) Int. Cl.
  *H01L 21/302*    (2006.01)
  *H01L 21/461*    (2006.01)
(52) U.S. Cl. .................. 438/704; 438/706; 438/725; 438/745
(58) Field of Classification Search .................. None
  See application file for complete search history.

(56) References Cited

U.S. PATENT DOCUMENTS

| | | | |
|---|---|---|---|
| 5,510,645 A | * | 4/1996 | Fitch et al. .................. 257/522 |
| 6,287,979 B1 | * | 9/2001 | Zhou et al. .................. 438/723 |
| 6,358,842 B1 | * | 3/2002 | Zhou et al. .................. 438/633 |
| 6,498,070 B2 | * | 12/2002 | Chang et al. .................. 438/421 |
| 7,285,474 B2 | * | 10/2007 | Anderson et al. ........... 438/411 |
| 7,400,024 B2 | * | 7/2008 | Kunnen ...................... 257/511 |
| 2005/0074961 A1 | | 4/2005 | Beyer et al. |
| 2005/0266683 A1 | * | 12/2005 | Lee ............................. 438/638 |

* cited by examiner

*Primary Examiner*—Allan Olsen
(74) *Attorney, Agent, or Firm*—Thomas, Kayden, Horstemeyer & Risley

(57) ABSTRACT

A method for fabricating an interconnect structure in a semiconductor device. A masking layer is formed on a dielectric layer formed on a substrate, having at least one opening. The opening is transferred into the dielectric layer. A Plasma stripping process is performed to remove the masking layer, such that a damaged sidewall portion of the dielectric layer surrounding the opening therein is formed. The opening in the dielectric layer is filled with a conductive element. The damaged sidewall portion of the dielectric layer is removed to form a gap between the dielectric layer and the conductive element, wherein substances from removal of the damaged sidewall portion of the dielectric layer are formed on the conductive element. The substances are removed using a citric acid solution.

20 Claims, 4 Drawing Sheets

METHOD FOR FABRICATING AIR GAP FOR SEMICONDUCTOR DEVICE

BACKGROUND OF THE INVENTION

1. Field of the Invention

The present invention relates to semiconductor technology, and in particular to a method for fabricating an interconnect structure with air gaps for a semiconductor device that reduces capacitance between interconnects while maintaining the mechanical strength of the interconnect structure.

2. Description of the Related Art

Production of smaller semiconductor devices on a chip is a key technology for the next generation of integrated circuits. As the downscaling of device dimensions continues, the distance between conductive interconnects is reduced to increase the integration density. The reduced dimensions of the interconnect necessitates that dielectric materials disposed between the conductive elements, have a lower dielectric constant (K) than previously utilized, due to the capacitive coupling between adjacent conductive elements in an integrated circuit (IC).

A reduced distance between the conductive elements, however, generates parasitic capacitance which undesirably increases time constant (RC) delay and power consumption in an IC, wherein R is the resistance and C is the capacitance of the IC. In order to achieve high speed, low power consumption ICs, parasitic capacitance must be reduced in an IC. As the device and interconnect density increases, parasitic capacitance becomes a significant problem. Although current low K dielectric materials can provide a K value of less than 4.0, materials having a lower K value are still required in order, to support the continued reduction in device dimensions and increased circuit density.

A common method utilized to form the interconnect structure in a semiconductor device is a damascene or dual damascene process. In this method, one or more low K dielectric layers is deposited on a substrate and patterned by lithography and etching, to form openings, such as trenches, via holes, or contact holes, for filling of conductive materials therein to serve as the interconnect. During stripping the photoresist mask which is utilized to define the low K dielectric layers, however, the sidewalls of openings may be damaged due to oxygen plasma stripping, causing a damage zone with a K value of more than that of the undamaged low K dielectric layer. As a result, undesirable parasitic capacitance between the conductive elements is increased.

Thus, there exists a need in the art for development of an improved method for fabricating an interconnect structure in a semiconductor device which can reduce capacitance between interconnects.

BRIEF SUMMARY OF INVENTION

A detailed description is given in the following embodiments with reference to the accompanying drawings. Methods for fabricating an interconnect structure in a semiconductor device are provided. An exemplary embodiment of a method for fabricating an interconnect structure in a semiconductor device comprises forming a dielectric layer on a substrate. A masking layer is formed on the dielectric layer, having at least one opening. An exposed dielectric layer is etched to transfer the opening into the dielectric layer. A plasma stripping process is performed to remove the masking layer, such that a damaged sidewall portion of the dielectric layer surrounding the opening therein is formed. The opening in the dielectric layer is filled with a conductive element. The damaged sidewall portion of the dielectric layer is removed to form a gap between the dielectric layer and the conductive element, wherein substances from removal of the damaged sidewall portion of the dielectric layer are formed on the conductive element. The substances are removed using a citric acid solution.

Another exemplary embodiment of a method for fabricating an interconnect structure in a semiconductor device comprises forming a dielectric layer on a substrate. A masking layer is formed on the dielectric layer, having at least one opening. An exposed dielectric layer is etched to transfer the opening into the dielectric layer. A plasma stripping process is performed to remove the masking layer, such that a damaged sidewall portion of the dielectric layer is formed surrounding the opening therein. The opening in the dielectric layer is filled with a conductive element. The damaged sidewall portion of the dielectric layer is removed to form a gap between the dielectric layer and the conductive element, wherein metal ion impurities from removal of the damaged sidewall portion of the dielectric layer are formed on the conductive element. The metal ion impurities are removed.

Yet another exemplary embodiment of a method for fabricating an interconnect structure in a semiconductor device comprises forming a dielectric layer on a substrate. A masking layer is formed on the dielectric layer, having at least one opening. An exposed dielectric layer is etched to transfer the opening into the dielectric layer. A plasma stripping process is performed to remove the masking layer, such that a damaged sidewall portion of the dielectric layer surrounding the opening therein is formed. The opening in the dielectric layer is filled with a conductive element. The damaged sidewall portion of the dielectric layer is removed to form a gap between the dielectric layer and the conductive element, wherein metal ion impurities and particles from removal of the damaged sidewall portion of the dielectric layer are formed on the conductive element. The metal ion impurities and the particles are removed by brush scrubbing using a citric acid solution.

BRIEF DESCRIPTION OF DRAWINGS

The present invention can be more fully understood by reading the subsequent detailed description and examples with references made to the accompanying drawings, wherein:

FIG. 1E-1 is a cross section showing another step of forming gaps in the dielectric layer shown in FIG. 1D;

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims. Methods for fabricating an interconnect structure in a semiconductor device will be described below with reference to the accompanying drawings.

Figure 1A:
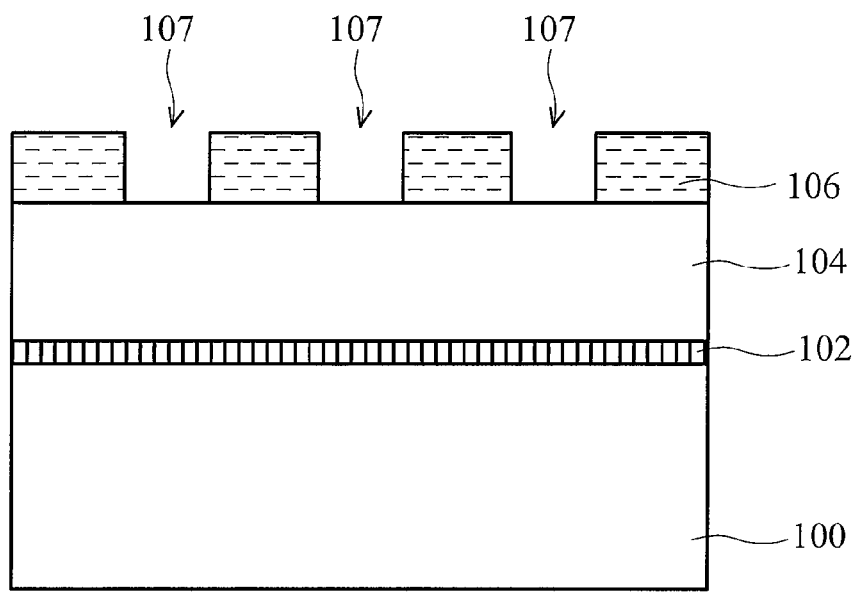
FIG. 1A is a cross section showing the step of defining openings for deposition of a dielectric layer on a substrate.

The invention relates to an improved method of fabricating an interconnect structure with air gaps. FIG. 1A illustrates a step in which openings are defined for deposition of a dielectric layer on a substrate. In FIG. 1A, a substrate 100 is provided. The substrate 100, such as a silicon substrate or other semiconductor substrates, may contain a variety of elements, including, for example, transistors, resistors, and other semiconductor elements as are well known in the art. In order to simplify the diagram, a flat substrate is depicted. An etch stop layer 102 may be optionally deposited on the substrate 100. The etching stop layer 102 may comprise silicon nitride, silicon oxynitride or silicon carbide. A dielectric layer 104, serving as an interlayer dielectric (ILD) or intermetal dielectric (IMD) layer overlies the substrate 100. For example, the dielectric layer 104 may be silicon dioxide, phosphosilicate glass (PSG), borophosphosilicate glass (BPSG). Preferably, the dielectric layer 104 comprises a low dielectric constant (K) material having a dielectric constant of less than 4.0 to achieve low RC time constant (resistance-capacitance), such as fluorosilicate glass (FSG), organo silicate glass (OSG), methyl silsesquioxane (MSQ), hydrogen silsesquioxane (HSQ), black diamond™ (BD, a trademark of Applied Materials company) or the like. The dielectric layer 104 can be formed by conventional deposition, such as plasma enhanced chemical vapor deposition (PECVD), low pressure CVD (LPCVD), atmospheric pressure CVD (APCVD), high-density plasma CVD (HDPCVD), spin-on deposition or other suitable deposition techniques. A masking layer 106, such as a photoresist layer, is formed on the dielectric layer 104. The masking layer 106 is subsequently patterned to form openings 107 exposing the underlying dielectric layer 104.

Figure 1B:
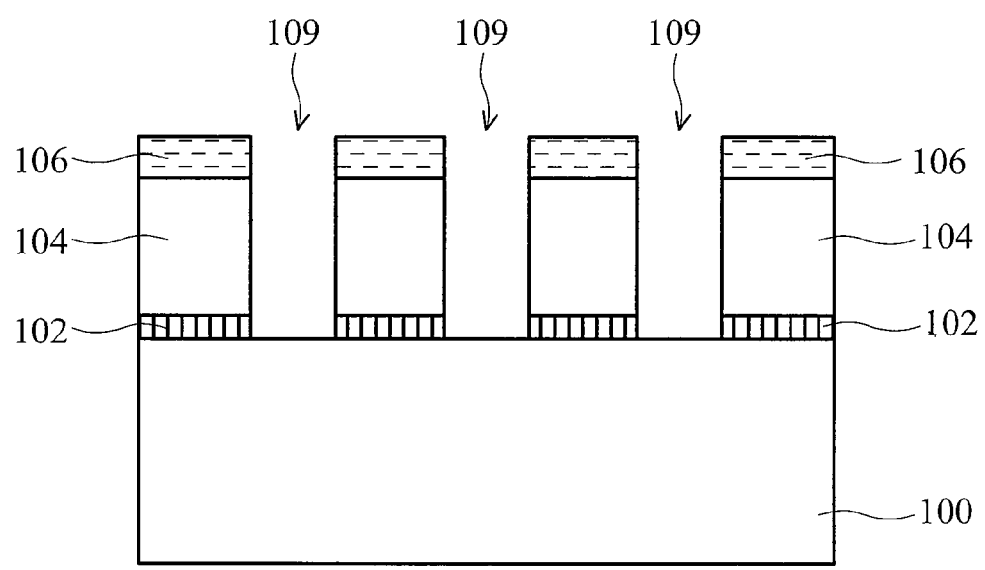
FIG. 1B is a cross section showing the step of forming openings in the dielectric layer shown in FIG. 1A.

As shown in FIG. 1B, the exposed dielectric layer 104 is removed by conventional etching, such as reactive ion etching (RIE), using the masking layer 106 as an etching mask, to transfer the openings 107 in the dielectric layer 104, thus, openings 109 are formed to expose the underlying etching stop layer 102. Next, the exposed etching stop layer 102 is removed by etching to expose the substrate 100.

Figure 1C:
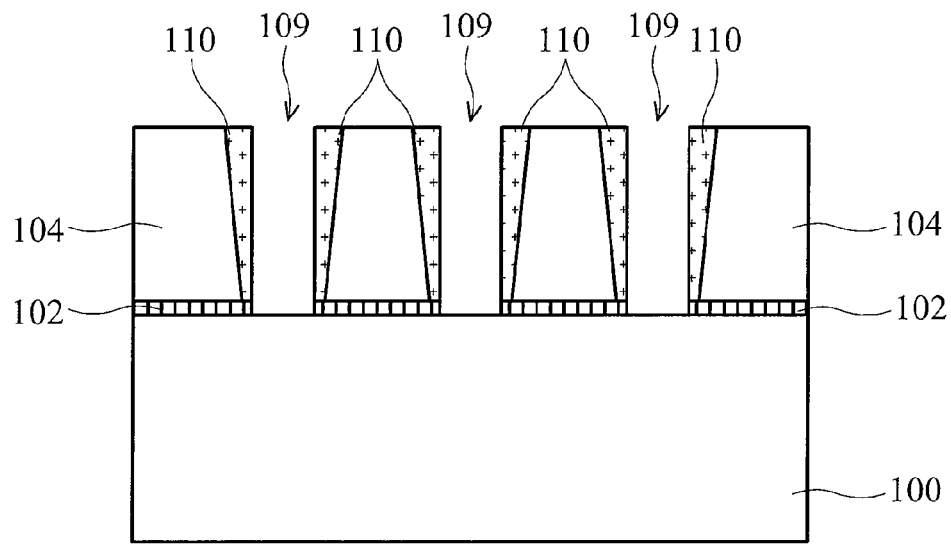
FIG. 1C is a cross section showing the step of forming damage zones in the dielectric layer shown in FIG. 1B.

As shown in FIG. 1C, the unnecessary masking layer 106 shown in FIG. 1B is removed by conventional stripping. For example, the masking layer 106 is removed by oxygen containing plasma stripping process. During the plasma stripping, oxygen may react with the surface of the exposed dielectric layer 104 having low dielectric constant, such that damaged sidewall portions 110 of the dielectric layer 104 having a tapered profile and surrounding the openings 109 are formed. The damaged sidewall portions 110 of the dielectric layer 104 typically have a dielectric constant higher than that of the dielectric layer 104 without damage. Generally, the damaged sidewall portions 110 of the dielectric layer 104 have higher dielectric constant more than 6. As a result, the capacitance between the adjacent conductive elements formed in subsequent steps may be increased, increasing RC delay, as well as increasing power consumption and signal errors.

Figure 1D:
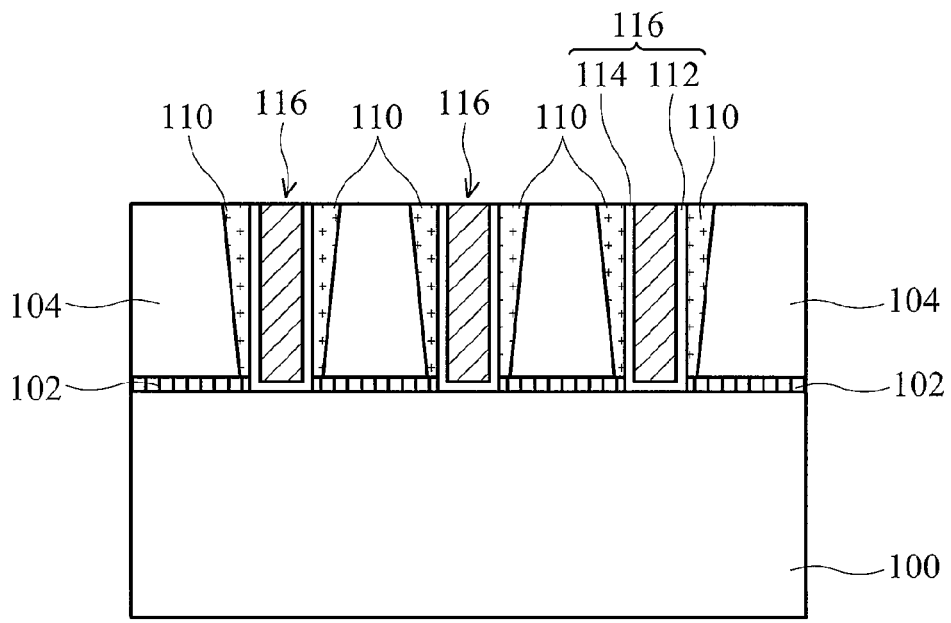
FIG. 1D is a cross section showing the step of forming conductive elements in the dielectric layer shown in FIG. 1C.
Figure 1E:
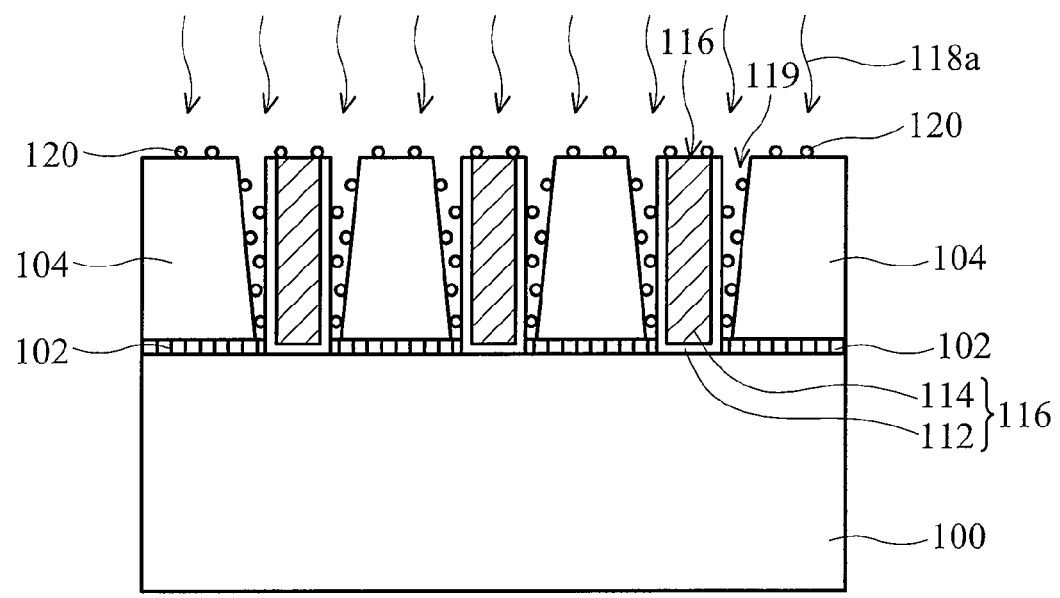
FIG. 1E is a cross section showing the step of forming gaps in the dielectric layer shown in FIG. 1D.

In order to solve this problem, the damaged sidewall portions 110 of the dielectric layer 104 must be removed prior to completion of the interconnect structure to prevent the capacitance between the adjacent conductive elements from increasing. In this embodiment, however, the space formed by removing the damaged sidewall portions 110 of the dielectric layer 104 may act as air gaps to further reduce the capacitance because the air gap has a dielectric constant of approximately 1.0. FIGS. 1D to 1E illustrate an embodiment of a method for forming gaps in the dielectric layer 104. In FIG. 1D, the openings 109 are filled with a conductive element 116. For example, a diffusion barrier layer (not shown), such as titanium nitride, tantalum nitride or other well known diffusion barrier material, is formed on the dielectric layer 104 and lines the inner surfaces of the openings 109. A metal layer (not shown), such as aluminum or copper, is formed overlying the dielectric layer 104 and completely fills the openings 109. The excess metal and diffusion barrier layers on the top surface of the dielectric layer 104 are successively removed by, for example, chemical mechanical polishing (CMP). The remaining metal layer 114 and diffusion barrier liner 112 in the opening 109 constitute the conductive element 116 (i.e. an interconnect).

Figures 1, 1E:
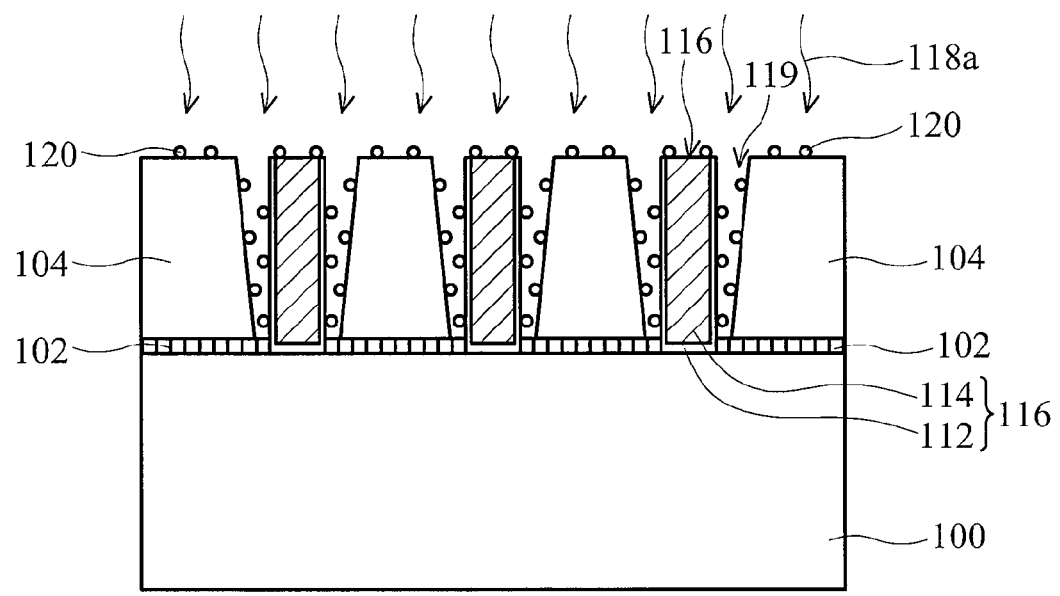

Next, in FIG. 1E, the damaged sidewall portions 110 of the dielectric layer 104 shown in FIG. 1D are removed to form gaps 119 between the dielectric layer 104 and each conductive element 116. In this embodiment, the damaged sidewall portions 110 of the dielectric layer 104 may be removed by dipping in 1% (vol.) HF acid solution 118 for 10 s to 100 s and 20 s is preferable. In some embodiments, the damaged sidewall portions 110 of the dielectric layer 104 may be removed by dipping in a solution 118a comprising $CH_3COOH$, $NH_4F$ and HF for 10 s to 100 s and 20 s is preferable, as shown in FIG. 1E-1. In some embodiments, the damaged sidewall portions 110 of the dielectric layer 104 may be removed by dipping in a solution comprising $CH_3COOH$ and buffer oxide etchant (BOE). Since the solution comprising $CH_3COOH$ and BOE may partially etch the diffusion barrier materials, such as tantalum nitride, a portion of diffusion barrier liner 112 adjacent to the gaps 119 can be removed, thereby thinning the diffusion barrier liner 112. Compared to the conductive elements 116 shown in FIG. 1E, the effective conductivity of the conductive elements 116 can be further increased.

Figure 1F:
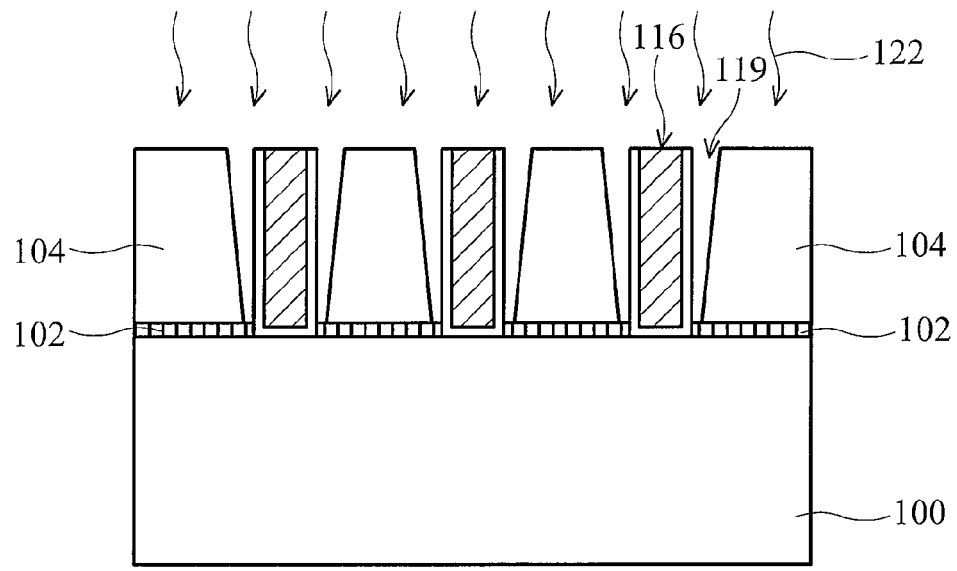
FIG. 1F is a cross section showing the step of cleaning the substrate shown in FIG. 1E.

After removing the damaged sidewall portions 110 of the dielectric layer 104, however, substances 120, such as metal ion impurities and particles induced from removal of the damaged sidewall portions 110 of the dielectric layer 104 are formed on the conductive elements 116 and in the gaps 119, as shown in FIGS. 1E and 1E-1. The metal ion impurities and particles from removal of the damaged sidewall portions 110 may induce serious leakage between the adjacent conductive elements 116. In order to solve this problem, cleaning process 122 is performed on the substrate structure shown in FIG. 1E to remove the metal ion impurities and particles from removal of the damaged sidewall portions 110 on the conductive elements 116 and in the gaps 119, as shown in FIG. 1F. In this embodiment, the cleaning process 122 may comprise dipping the dielectric layer 104 having conductive elements 116 therein in a citric acid solution for 10 s to 100 s, and 40 s is preferable. The concentration of citric acid is about 4 vol. %. Next, the dielectric layer 104 having the conductive elements 116 therein is dipped in deionized water (DIW) for 10 s to 100 s, and 35 s is preferable. In some embodiments, the cleaning process 122 may comprise brush scrubbing using the citric acid solution, thereby effectively removing the metal ion impurities and particles. The brush scrubbing may be performed for by a brush scrubbing or CMP tool. After completion of cleaning process 122, the dielectric layer 104 having the conductive elements 116 therein is baked in nitrogen ambient to release moisture. In this embodiment, the baking can be performed at a temperature of about 200° C. to 350° C. for 20 min to 40 min.

Figure 1G:
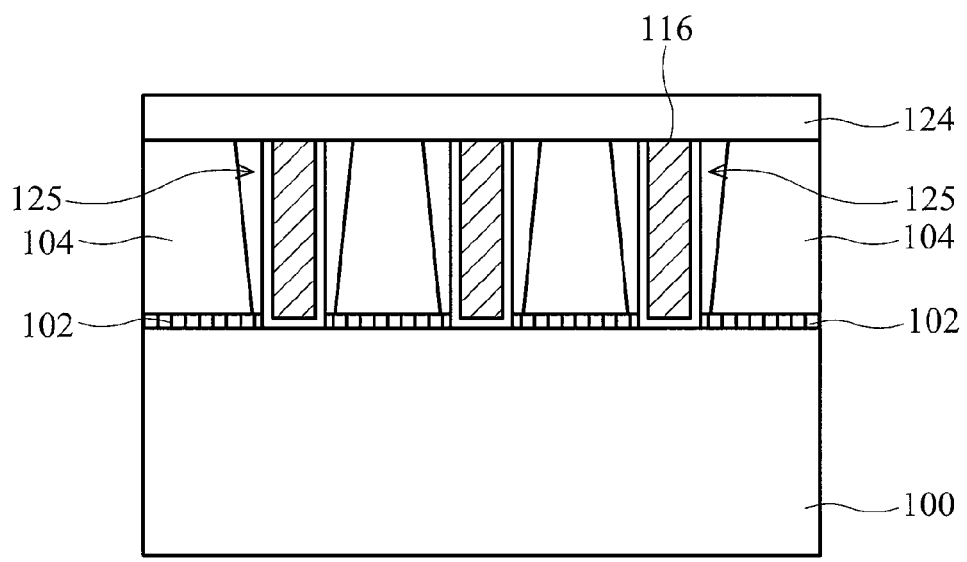
FIG. 1G is a cross section showing the step of forming a cap layer over the substrate shown in FIG. 1E.

As shown in FIG. 1G, the dielectric layer 104 having the conductive elements 116 therein is covered with a cap layer 124 to form air gaps 125 in the dielectric layer 104 and surround the conductive elements 116 and the fabrication of the interconnect structure in a semiconductor device of the invention is complete. The cap layer 124 may be a single layer comprising silicon carbide or multiple layers comprising silicon carbide, silicon oxide and silicon nitride. Moreover, the cap layer 124 can be formed by conventional deposition, such as CVD.

According to the invention, since the interconnect structure has air gaps with dielectric constant of approximately 1, the capacitance between conductive lines or plugs can be reduced to reduce RC delay. Moreover, since the air gaps only occupy a small space in the dielectric layer, the mechanical strength of the dielectric layer can be kept as well as the dielectric layer without air gaps formed therein. Moreover, since the metal ion impurities and the particles formed after forming gaps in the dielectric layer can be removed, leakage between conductive lines or plugs can be reduced. Furthermore, since the diffusion barrier liner can be further thinned, the resistivity of the conductive line or plug can be reduced to further improve RC delay effect.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an interconnect structure in a semiconductor device, comprising:
    forming a dielectric layer on a substrate;
    forming a masking layer on the dielectric layer, comprising at least one opening to expose the dielectric layer;
    etching the exposed dielectric layer to transfer the opening into the dielectric layer;
    performing a plasma stripping process to remove the masking layer, such that a damaged sidewall portion of the dielectric layer surrounding the opening therein is formed;
    filling the opening in the dielectric layer with a conductive element;
    removing the damaged sidewall portion of the dielectric layer to form a gap between the dielectric layer and the conductive element, wherein substances from removal of the damaged sidewall portion of the dielectric layer are formed on the conductive element; and
    removing the substances using a citric acid solution.

2. The method as claimed in claim 1, wherein the substances comprise metal ion impurities.

3. The method as claimed in claim 1, wherein the substances are removed by brush scrubbing using the citric acid solution.

4. The method as claimed in claim 3, wherein the substances comprise particles.

5. The method as claimed in claim 1, further comprising:
    baking the dielectric layer; and
    covering the dielectric layer and the conductive element with a cap layer.

6. The method as claimed in claim 1, wherein the masking layer comprises a photoresist layer and is removed by oxygen containing plasma stripping.

7. The method as claimed in claim 1, wherein the conductive element comprises a diffusion barrier material and a metal material.

8. The method as claimed in claim 7, wherein a portion of the diffusion barrier material is removed during removing the damaged sidewall portion of the dielectric layer.

9. A method for fabricating an interconnect structure in a semiconductor device, comprising:
    forming a dielectric layer on a substrate;
    forming a masking layer on the dielectric layer, comprising at least one opening to expose the dielectric layer;
    etching the exposed dielectric layer to transfer the opening into the dielectric layer;
    performing a plasma stripping process to remove the masking layer, such that a damaged sidewall portion of the dielectric layer surrounding the opening therein is formed;
    filling the opening in the dielectric layer with a conductive element;
    removing the damaged sidewall portion of the dielectric layer to form a gap between the dielectric layer and the conductive element, wherein metal ion impurities from removal of the damaged sidewall portion of the dielectric layer are formed on the conductive element; and
    removing the metal ion impurities.

10. The method as claimed in claim 9, wherein the metal ion impurities are removed by brush scrubbing using the citric acid solution.

11. The method as claimed in claim 9, wherein particles from removal of the damaged sidewall portion of the dielectric layer are formed on the conductive element.

12. The method as claimed in claim 11, further removing the particles by brush scrubbing.

13. The method as claimed in claim 9, wherein the masking layer comprises a photoresist layer and is removed by oxygen containing plasma stripping.

14. The method as claimed in claim 9, wherein the conductive element comprises a diffusion barrier material and a metal material.

15. The method as claimed in claim 14, wherein a portion of the diffusion barrier material is removed during removing the damaged sidewall portion of the dielectric layer.

16. A method for fabricating an interconnect structure in a semiconductor device, comprising:
    forming a dielectric layer on a substrate;
    forming a masking layer on the dielectric layer, comprising at least one opening to expose the dielectric layer;
    etching the exposed dielectric layer to transfer the opening into the dielectric layer;
    performing a plasma stripping process to remove the masking layer, such that a damaged sidewall portion of the dielectric layer surrounding the opening therein is formed;
    filling the opening in the dielectric layer with a conductive element;
    removing the damaged sidewall portion of the dielectric layer to form a gap between the dielectric layer and the conductive element, wherein metal ion impurities and particles from removal of the damaged sidewall portion of the dielectric layer are formed on the conductive element; and
    removing the metal ion impurities and the particles by brush scrubbing using a citric acid solution.

17. The method as claimed in claim 16, wherein the masking layer comprises a photoresist layer and is removed by oxygen containing plasma stripping.

18. The method as claimed in claim 16, wherein the conductive element comprises a diffusion barrier material and a metal material.

19. The method as claimed in claim 18, wherein a portion of the diffusion barrier material is removed during removing the damaged sidewall portion of the dielectric layer.

20. The method as claimed in claim 16, wherein the damaged sidewall portion of the dielectric layer is removed using a solution comprising $CH_3COOH$, $NH_4F$ and HF.

* * * * *